United States Patent
Hulfachor et al.

[11] Patent Number: 6,100,125
[45] Date of Patent: Aug. 8, 2000

[54] LDD STRUCTURE FOR ESD PROTECTION AND METHOD OF FABRICATION

[75] Inventors: Ronald Brett Hulfachor, Standish; Steven Leibiger, Falmouth; Michael Harley-Stead; Daniel James Hahn, both of Portland, all of Me.

[73] Assignee: Fairchild Semiconductor Corp., South Portland, Me.

[21] Appl. No.: 09/161,354

[22] Filed: Sep. 25, 1998

[51] Int. Cl.⁷ ............................................. H01L 21/8238
[52] U.S. Cl. .................. 438/224; 438/226; 357/360; 357/355
[58] Field of Search .................. 438/224, 226; 357/360, 355

[56] References Cited

U.S. PATENT DOCUMENTS

| | | | |
|---|---|---|---|
| 4,602,267 | 7/1986 | Shirato | 357/35 |
| 4,672,419 | 6/1987 | McDavid | 357/71 |
| 4,949,136 | 8/1990 | Jain | 357/23.3 |
| 5,055,896 | 10/1991 | Williams et al. | 357/23.8 |
| 5,091,763 | 2/1992 | Sanchez | 357/23.9 |
| 5,132,753 | 7/1992 | Chang et al. | 357/23.4 |
| 5,164,801 | 11/1992 | Hieda et al. | 257/344 |
| 5,208,472 | 5/1993 | Su | 257/344 |
| 5,243,212 | 9/1993 | Williams | 257/344 |
| 5,338,960 | 8/1994 | Beasom | 257/335 |
| 5,366,908 | 11/1994 | Pelella | 438/224 |
| 5,389,809 | 2/1995 | Haken et al. | 257/344 |
| 5,440,162 | 8/1995 | Worley et al. | 257/355 |
| 5,453,635 | 9/1995 | Hsu et al. | 257/336 |
| 5,479,367 | 12/1995 | Maurelli et al. | 365/182 |
| 5,493,142 | 2/1996 | Randazzo et al. | 257/328 |
| 5,498,892 | 3/1996 | Walker et al. | 257/336 |
| 5,618,740 | 4/1997 | Huang | 438/224 |
| 5,637,902 | 6/1997 | Jiang | 257/379 |
| 5,959,332 | 9/1999 | Ravanelli et al. | 257/360 |

*Primary Examiner*—Charles Bowers
*Assistant Examiner*—D S Blum
*Attorney, Agent, or Firm*—Pierce Atwood; Chris A. Caseiro

[57] ABSTRACT

An ESD protection device including a transistor structure with resistive regions located within active areas thereof. The transistor structure is formed of one or more MOS transistors, preferably N-type MOS transistors. The drain regions of the transistors are modified to reduce the conductivity of those resistive regions by preventing high carrier concentration implants in one or more sections of the drain regions. This is achieved by modifying an N LDD mask and the steps related thereto, as well as a silicide exclusion mask and the steps related thereto. The modifications result in the omission of N LDD dopant from the area immediately adjacent to the underlying channel. In addition, portions of a spacer oxide remain over the drain region to be formed. Subsequent implant and siliciding steps are effectively blocked by the spacer oxide that remains, leaving a low-density drain (LDD) charge carrier concentration in those regions, except where omitted. The resistivity of those resistive LDD regions is greater than the resistivity of the adjacent portions of the drain region. The result is more uniform turn-on of ESD transistor fingers in a protection device set without the need to add valuable layout space and without increased processing steps.

6 Claims, 8 Drawing Sheets

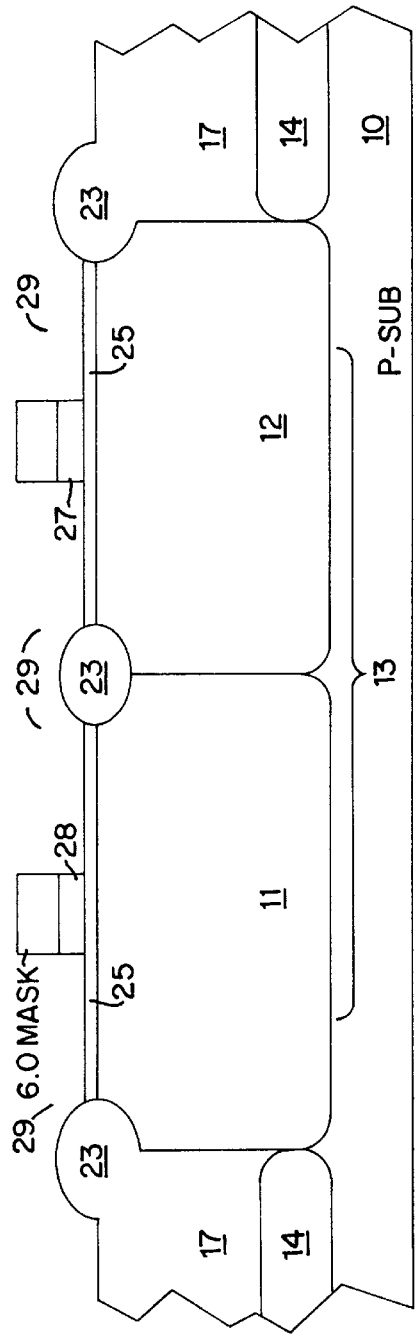
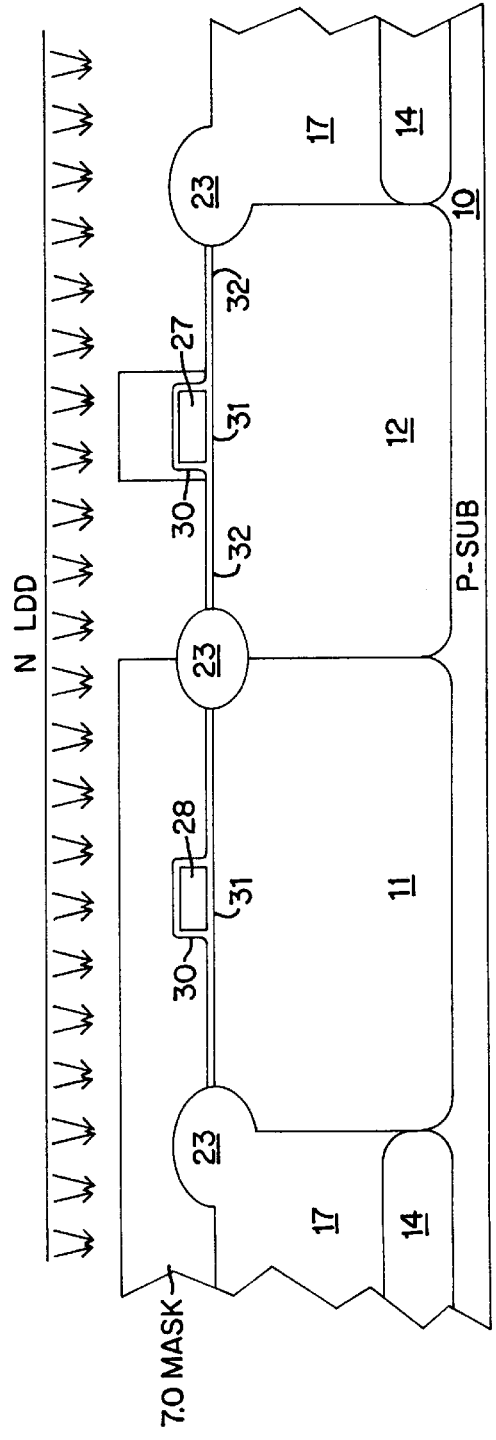
FIG 7 (PRIOR ART)
FIG 8 (PRIOR ART)

LDD STRUCTURE FOR ESD PROTECTION AND METHOD OF FABRICATION

BACKGROUND OF THE INVENTION

1. Field of the Invention

The present invention relates to Electrostatic Discharge Protection (ESDP) devices. In particular, the present invention relates to Metal-Oxide-Silicon (MOS) transistors used to provide ESDP, including, but not limited to, N-type MOS transistors. More particularly, the present invention relates to the introduction of a tailored low-density drain (LDD) region of such MOS transistors to provide sufficient insulative characteristics without reliance upon standard field oxide isolation.

2. Description of the Prior Art

The fabrication of increasingly smaller integrated circuit (IC) devices has made the reliance upon effective smaller ESDP devices more important. It is well known that transient voltage surges, referred to as electrostatic discharges that may be thousands of volts, commonly occur at the input/output terminals of IC's. These terminals are electrically coupled to active circuit components including, but not limited to, bipolar and MOS transistors. It is important to block ESD events or to divert ESD events away from the gates of transistors, particularly those transistors acting as circuit buffers, in order to ensure that the transistors are not destroyed or otherwise compromised. When that occurs, operation of the circuit can be adversely affected, including the possibility of system failure.

As ESD problems are widespread, wide arrays of solutions have been developed. For the most part, these solutions have involved the addition of low-breakdown transistors or diodes placed between the input/output and buffer so as to divert the ESD's away from the buffer. That is, the transistor or diode is designed to be non-conducting under expected potential values, and conducting when a potential on an input or output buffer node exceeds those expected values. When turned on by the higher-than-expected potential, the ESD device diverts current associated with such transient conditions away from the critical buffer node. Commonly, it is desirable to have the transient current diverted to a low-potential power rail, generally defined as ground. N-type MOS (NMOS) transistors are used to achieve that end.

More recently, pluralities of NMOS transistors have been employed in parallel combination to provide protection. However, it is important in such a configuration to make sure that each of the "fingers" of the combination turns on at substantially the same time. Failure to do so will result in the first of the transistors in the set to turn on to support the entire transient load. That generally causes failure of that transistor unit as well as the entire ESD protection device. Ballast resistance is required in these devices as a means to alleviate problems of non-simultaneous turn-on; however, the ballast that is often required can lead to unacceptable increases in transistor set size. Variations occurring during processing of the prior ballasted ESD devices further tend to yield unreliable ESD protection, particularly where vertical pathways and field oxides were relied upon to provide the resistance. It is well known that such pathways can vary substantially in resistance from one site to another.

While tremendous effort is made to make the fabrication of semiconductor devices as accurate as possible, there will remain vagaries in active device characteristics from one production run to another and even within production runs. Given the size of the devices currently being made, the problems associated with any vagaries in, for example, doping levels, doping depths, alignment, and the like, are amplified. It is therefore important to isolate distinct active areas as much as possible so that the deficiencies in one area will not automatically affect adjacent active areas detrimentally. In prior fabrication processes, isolation regions could be made relatively large. One such type of isolation region, the field oxide, is introduced substantially at the surface of a semiconductor wafer between active areas. The field oxide is dopant deficient such that it is a poor conductor with respect to the active areas of the fabricated semiconductor product. However, as earlier indicated, that doping level can vary considerably.

The isolating field oxide regions, as well as other isolation and active areas, are formed as part of an integrated fabrication process. The process includes a series of "mask" steps highlighted by the application of photoresistant materials used to define the boundaries of regions of semiconductor material to be etched or implanted with dopant material. Of course, pursuant to the desire to make increasingly smaller systems, it is a goal to tightly control and minimize structure dimensions. It is also a goal to place active elements at or near the surface of the structure. Achievement of at least these two goals results in faster, more reliable, integrated circuits requiring less power to operate than prior-art circuits.

Present advanced fabrication techniques provide bipolar and MOS transistor structures, including NMOS transistors for use as ESDP devices, with these desired characteristics. One fabrication process found to be particularly useful in forming desired MOS integrated circuits, including NMOS and P-type MOS (PMOS) transistors, is summarized in the following table of mask steps.

| Mask No. | Mask Function |
| --- | --- |
| 1.0 | Retrograde NWell Definition Mask |
| 2.0 | Retrograde PWell/Channel Stop Definition Mask |
| 3.0 | Isolation Oxide Definition Mask |
| 4.0 | MOS Active Area Definition Mask |
| 5.0 | Active Strip Mask |
| 6.0 | Poly Gate Definition Mask |
| 7.0 | N LDD Mask |
| 8.0 | P LDD Mask |
| 9.0 | Silicide Exclusion Mask |
| 10.0 | P$^+$ Source/Drain Definition Mask (PMOS) |
| 11.0 | N$^+$ Source/Drain Definition Mask (NMOS) |
| 12.0 | MOS Contact Definition Mask |
| 13.0 | METAL 1 (M1) Definition Mask |
| 14.0 | METAL 2 (M2) Definition Mask |

While there are many steps and stages associated with the complete fabrication of an integrated circuit on a semiconductor wafer, the ones set out above and described briefly herein are directly applicable to the present invention. Initially, in regard to making the PMOS and NMOS structures, an "NWell" and a "PWell" are first created on a P type substrate of semiconductor material, using conventional fabrication sequences. This is accomplished by introducing, such as by implantation, respectively, an N concentration of relatively fast-diffusing N type atoms to form an NWell "bed" for the PMOS structure, and a P concentration of relatively fast-diffusing P type atoms to form a PWell "bed" for the NMOS structure. After NWell and PWell bed introduction into the substrate, an epitaxial layer in the form of single crystal N type semiconductor material in an N-concentration is formed over both well beds. Prior integrated circuit fabrication techniques involved the formation of epitaxial layers with charge carrier doping levels on the order of $1-3\times10^{16}$ atoms/cc. The present fabrication process summarized above for sub-micron devices involves the formation of the epitaxial layer with a charge carrier doping level of about $1-3\times10^{15}$ atoms/cc.

Subsequent conventional diffusion processing drives the NWell and PWell atoms in retrograde concentrations to the surface of the epitaxial layer. Isolation oxide layers are formed about the MOS transistor structures by conventional mask, etch, and formation sequences so as to isolate them from adjacent structures. The field oxide regions are formed are formed above the isolation regions using a field oxide region definition mask in order to further isolate adjacent structures. Channel stop regions, formed at the same time and of the same atom type as the PWell, underlie the isolation oxide regions surrounding both the retrograde NWell and retrograde PWell. The channel stops isolate the wells from parasitic MOS effects caused by adjacent structures.

Formation of the completed MOS transistor structures requires the fabrication of the gate, source, and drain components of the NMOS and PMOS transistor structures. The gates are formed of a polycrystalline layer of semiconductor material, using a well-known mask, etch, and deposition sequence. These "poly gates" are formed on the surface of the respective wells, but are separated from the well surfaces by an underlying gate oxide layer. This gate oxide layer acts as a dielectric, insulating the gate of the particular MOS transistor structure from the source, the drain, and the channel lying therebetween.

After poly gate formation, a sealing oxide is formed on the surface of the gates and on the active regions of the MOS wells. This thermally-grown sealing oxide protects the gates and CMOS wells during subsequent "lightly-doped drain" (LDD) implantation steps. It is also part of the architecture that provides for "self-alignment" of the soon-to-be-formed source and drain regions of the MOS transistors.

The next phase of MOS transistor development involves the formation of the source and drain regions. Initially, a relatively fast-diffusing N type atom in an N concentration is shallowly implanted in the surface of the PWell and a relatively fast-diffusing P type atom in an N concentration is shallowly implanted in the surface of the NWell. These initial implants are designed to extend slightly beyond the final dimensions of the source and drain regions, resulting in an effective gate channel length in the range 0.4–0.6 micron. The purpose of this initial implant is to minimize hot electron effects in the transistor channel region. The initial implant procedure includes the formation of the N LDD and P LDD regions in both transistor types. In addition to initiating the formation of the well-defined source and drain regions, the shallow LDD also provides a gradual transition from source or drain to the channel region, thereby reducing hot electron effects. Of course, with the much smaller structures fabricated today, the importance of the LDD in reducing hot electron effects increases. The LDD regions are less heavily doped than the specific source and drain regions, but more heavily doped than the insulative oxide regions immediately adjacent to the active areas. It is this portion of the fabrication process that is related to the creation of the ESDP transistor of the present invention.

In order to produce shallower, and therefore faster, devices, and properly sized source and drain regions, a spacer oxide is deposited to a thickness of about 2000 Å over the future source and drain regions and the poly gates. The spacer oxide is then etched to expose substantially all of the active areas of the device during the silicide exclusion step. Etching of the spacer oxide exposes the top of the gate and the subsequent source and drain regions for following ion implants and metal deposition. However, at the sides of the built-up area associated with the gates, the spacer oxide layer is significantly thicker than in the other areas. As a result, the etching sequence leaves sealing material in place at the sides of the gate. This is beneficial in subsequent ion implanting in that the gate-side sealing layer blocks such implants, leaving the LDD region ion levels fixed throughout the process for purposes earlier noted regarding hot electron effects. The gate-side sealing layer also acts as one portion of the means for ensuring self-alignment of the active areas that are to become the source and drain regions.

Following the sealing layer etching process, relatively slow-diffusing P type atoms in a $P^+$ concentration in the surface of the NWell and relatively slow-diffusing N type atoms in an $N^+$ concentration are introduced into the surface of the PWell, using conventional mask, etch and implant sequences, to define the source and drain regions of the PMOS and NMOS transistor structures respectively. However, the implant does not occur in the active area immediately adjacent to the gate, due to the remaining gate-side sealing layer that acts as an implant blocker. Subsequent annealing drives the slow-diffusing atoms to pre-defined depths in the respective wells. Fabrication steps well known in the field provide the necessary contact sites, insulative surface regions, and metal conductors to complete the formation of the PMOS and NMOS transistors.

A preliminary conduction layer is defined by a metal-silicon combination identified as a silicide layer that provides a smooth transition between silicon-based layers of the active area and metal contacts. To the extent that it is possible to maintain the silicide layer proximate to the poly gate in light of the gate-side sealing layer, it is important to do so in order to lower the sheet resistance of the gate. However, prior attempts at improving ballast resistances in ESD protection devices have come at the expense of modifying the silicide layer and thereby impairing optimization of gate operation. In any event, in the general processing scheme, conventional bond pads that are the metal contacts are formed in order to couple the transistors to external circuitry, including by way of input/output nodes.

The advance fabrication process described above, particularly related to the self-alignment of source and drain regions using poly gates, and the LDD doping, can be utilized to form a transistor device that solves ESD problems in the manner previously noted. However, in standard fabrication processes of the type described, there are steps taken to enhance transistor action that adversely affect ESDP capability. Specifically, conductive materials added to the surface of the structure adjacent to the source and drain regions reduce the resistance associated with those areas and thereby improve the transistor's operational characteristics. However, it is also important to provide series resistance between adjacent regions of the transistor structure in order to provide effective ESD protection. These contrasting goals can result in a compromise of transistor operation and ESD protection. Attempts to modify the effect of silicide layers at the transistor active region surfaces by reducing the ion concentration at the source and drain will increase resistance and therefore will be beneficial in an ESD protection device. However, this advance is offset by a reduction in transistor performance.

Prior attempts to improve ballast resistance for ESD transistors have been directed to modification of either the N+ implant step or the NWell formation step. In both instances, it is necessary to create very large active areas in order to produce satisfactory resistances of on the order of 50–100 Ω. It is well known that fabrication vagaries associated with active semiconductor device formation may yield lower than desired sheet resistances and limitations on available active area. These are two undesirable side effects of creating ballast resistance during either NWell or N+ source/drain formation.

U.S. Pat. No. 5,493,142 issued to Randazzo et al. describes one approach to formation of an ESD protection device. The LDD dopant procedure taught by Randazzo results in a penetration of the dopant into the channel underlying the gate. This has been determined to reduce by half the current carrying capability of the device during an ESD event. Further, the LDD reduces the peak electric field, slowing the ESD device's response. Such a limitation is undesirable. Yet further, and as alluded to herein, the Randazzo process provides for placement of the silicide exclusion mask edge on the gate. This can produce an increase in the sheet resistance of the gate that will be variable as a function of the lack of control in alignment to the gate edge.

U.S. Pat. No. 5,498,892 issued to Walker et al. describes another approach to formation of ballast resistance, in which selected portions of the drain region of an NMOS transistor are blocked with photoresist from the N+ mask step. However, the fabrication process utilized by Walker does not include the application of silicide, which is needed for enhanced transistor action. The Walker ballast resistor process therefore does not address a method that includes the use of silicide and therefore does not address the need to exclude silicide in the drain of an ESD device while allowing silicide on other circuitry.

Therefore, what is needed is an ESD protection device that protects a node while maintaining sufficient and well-controlled resistance characteristics, including the "fingers" of an ESD-protection transistor set, so that activation is reliable. What is also needed is such a protection device that maintains such resistance with increase to the overall size of the active area. Further, what is needed is an ESD protection device that can be fabricated with minimal intrusion on existing fabrication processes, namely, requiring extra masks. Finally, what is needed is such a device that provides adequate ESD protection with minimal compromise of the basic transistor structure's functional performance.

SUMMARY OF THE INVENTION

It is an object of the present invention to provide an ESD protection device that protects in a reliable way while maintaining suitable and well-controlled resistance characteristics, including those required in an ESD-protection transistor set having a plurality of "fingers" to ensure substantially simultaneous activation. It is also an object of the present invention to provide a protection device that maintains such resistance with minimal increase to the overall size of the active area. Further, it is an object of the present invention to provide an ESD protection device that can be fabricated with minimal intrusion on existing fabrication processes. Yet further, it is an object of the present invention to create a device that provides adequate ESD protection with minimal compromise of the basic structure's functional performance.

These and other objectives are achieved in the present invention through the modification of one or more mask steps to create a transistor configuration having improved resistance characteristics with little, if any, effect on standard transistor performance. In its preferred embodiment, the present invention is a set of NMOS transistors formed in a novel way using modified versions of the fabrication masks generally described herein. The modifications to the fabrication process result in an improved ESD protection device formed of one or more transistors that are preferably NMOS transistors. The novel ESD protection transistors of the present invention include use of the N LDD region as a way of increasing resistance with a minimal additional amount of silicon area. That is, in the process of fabricating the lightly-doped drain region-which by its nature has a higher sheet resistance than the subsequent drain contact silicide region—the N LDD region is maintained near the transistor's gate with little effect on the gate.

The invention provides for the incorporation of the fabrication of the modified ESD protection structure into the fabrication sequences for advanced CMOS and/or BiCMOS integrated circuits previously noted. The process steps related to the fabrication of the NMOS transistor structure of the preferred embodiment of the present invention involve the following specific mask sequence and associated mask steps:

| Mask No. | Mask Function |
| --- | --- |
| 1.0 | Retrograde NWell Definition Mask |
| 2.0 | Retrograde PWell/Channel Stop Definition Mask |
| 3.0 | Isolation Oxide Definition Mask |
| 4.0 | MOS Active Area Definition Mask |
| 5.0 | Active Strip Mask |
| 6.0 | Poly Gate Definition Mask |
| 7.0 | N LDD Mask |
| 9.0 | Silicide Exclusion Mask |
| 11.0 | N$^+$ Source/Drain Definition Mask (NMOS) |
| 12.0 | MOS Contact Definition Mask |
| 13.0 | METAL 1 (M1) Definition Mask |
| 14.0 | METAL 2 (M2) Definition Mask |

While the emphasis of the following discussion will focus upon the steps directed to advanced CMOS fabrication, it is to be understood that BICMOS fabrication steps can be adapted to form the structure of the present invention as well.

As previously noted, and with reference to the mask sequence presented above, the PWell of the CMOS transistor structure is formed by introducing a P concentration of relatively fast-diffusing atoms into the substrate of P type semiconductor material. The NWell is formed by introducing an N concentration of relatively fast-diffusing atoms into the substrate and adjacent to the PWell. As is well known, the semiconductor material may be any of a variety of types, including Silicon, Germanium, and Gallium-Arsenide.

The formation of the shallow LDD regions previously described is particularly well suited to providing sufficient sheet resistance to enable adequate ballasting of a multiple-transistor ESD protection arrangement. The doping levels associated with that region produce a sheet resistance of on the order of 1–2 kΩ per square. The NWell implant generally yields a sheet resistance of about 5 kΩ per square in the vicinity of the subsequent gate oxide layer. While that resistance is significantly higher than the resistance associated with the LDD region, it may be useful in some instances where a slower turn-on of the ESD protection is of interest; however, that will likely be at the expense of less control on actual ballast resistance.

The present invention involves the modification of the fabrication steps summarized above so that the drain region (or regions when multiple transistors are employed) includes one or more sections having a surface doping concentration less than that ordinarily associated with the N+ implant. Preferably, that includes modifying at least one mask step to ensure that the shallow N LDD region is not subsequently completely doped at the N+ levels. The N LDD implant provides a shallow LDD region in the PWell region doped at a charge carrier concentration level on the order of $4$–$8 \times 10^{17}$ atoms/cc. That N LDD doping concentration can be adjusted to an extent in order to modify the sheet resistance of that region of the transistor's drain. The stated N type carrier doping level results in an N LDD region sheet resistance of about 1–2 kΩ per square, a value suitable for the circuit operating characteristics while still providing either ESD or hot insertion protection.

The N LDD mask is not self-aligned and is instead larger than the gate so as to prevent implantation into the region adjacent to the channel. In particular, the edge that is developed is preferably about 0.2 μm away from the well-defined gate edge. This is important in order to prevent that N LDD insertion from diffusing into the channel region directly under the gate. This distinction is important in achieving the goal of creating an ESD device that is capable of handling more current than that handled by prior ESD devices exhibiting transistor characteristics.

With reference to the transistor fabrication steps noted above, at least one portion of a drain region opening in a Silicide Exclusion Mask of the Silicide Exclusion step is masked to block the etching of the oxide spacer layer. The resulting portion of the oxide spacer layer remaining over at least one portion of the drain region then acts as a blocker in subsequent N+ source and drain implant and silicide steps to form a resistive region of N LDD only.

The remaining fabrication steps in the process are substantially the same as earlier noted. That is, the self-aligned N+ implant occurs, Titanium is deposited, and silicide is formed on exposed silicon. Also, since the oxide layer region or regions remaining over the newly-formed N LDD resistive regions blocks suicide formation, subsequent silicide will not occur, just as it does not occur in the gate sidewall areas. Unlike the prior ESD devices noted herein, this particular fabrication step includes the formation of silicided regions on the active regions, which improves device performance generally. However, as earlier noted, siliciding can substantially reduce the sheet resistance of a ballast resistor associated with an ESD device. The present invention provides for improved ESD protection without eliminating the advantages associated with siliciding active areas.

The fabrication of the ESD protection device with increased resistance of the present invention is completed using standard process masks and steps as previously outlined herein. In addition to the new N LDD-resistive ESD transistor structure, the present invention also provides new CMOS and, optionally, BICMOS photo-definition masks including a new Silicide Exclusion to form the one or more N LDD-resistive regions.

These and other advantages of the present invention will become apparent upon review of the following detailed description, the accompanying drawings, and the appended claims.

BRIEF DESCRIPTION OF THE DRAWINGS

FIG. 7 is a simplified diagrammatic elevation view of the prior-art 6.0 Poly Gate Definition. Mask etch step, showing the source and drain region openings over the retrograde NWell and the retrograde PWell regions.

FIG. 8 is a simplified diagrammatic elevation view of the prior-art 7.0 N LDD Mask implant step, showing the uniform donor implantation, forming the LDD regions in the source and drain regions of the NMOS transistor.

DESCRIPTION OF THE PREFERRED EMBODIMENT OF THE INVENTION

A method of fabricating a new ESD protection transistor of the present invention is described in conjunction with a series of fabrication steps shown in FIGS. 1–12. The fabrication process used to form one or more ESD protection transistors has been integrated into CMOS fabrication steps previously noted, without adding any new steps. New CMOS mask structures are shown in FIGS. 9–12. The overall CMOS transistor structure mask sequence is the sequence summarized in the Summary of the Invention. While the present discussion relates to the formation of an NMOS transistor with an N type LDD resistive region, it is to be understood that the LDD region introduced may also be a P type LDD region, forming a PMOS transistor. However, in most instances, NMOS transistors are commonly used as buffers against the effects on input/output nodes of electrostatic discharges.

Figure 1:
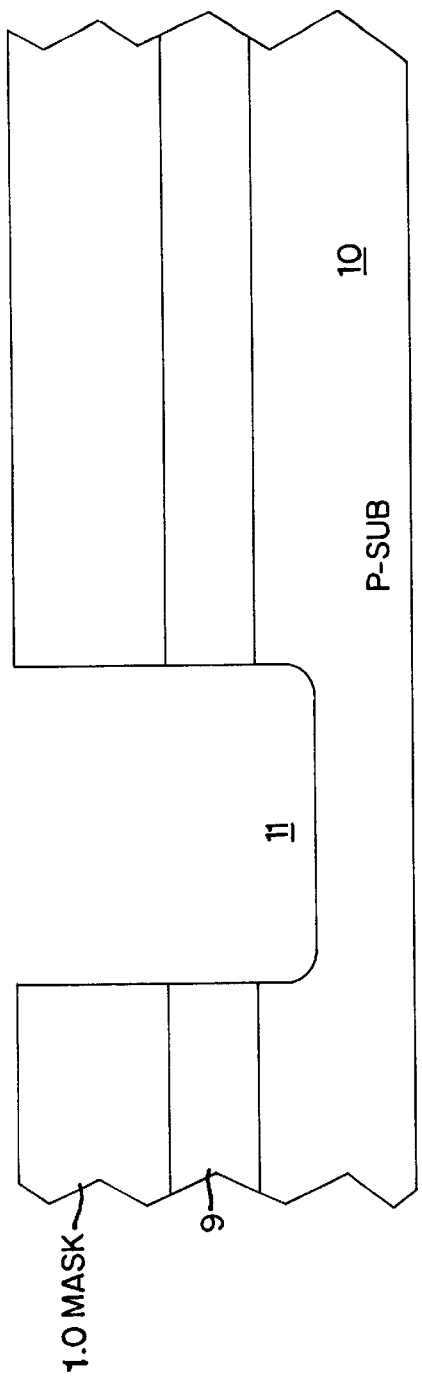
FIG. 1 is a simplified diagrammatic elevation view of the prior-art 1.0 Mask, etch and implant sequence of a CMOS or BICMOS fabrication process, showing the 1.0 NWell Definition Mask with CMOS NWell definition opening.

Prior to the fabrication sequences used to form the transistor structure of the present invention, an initial oxide layer 9 is grown from a substrate 10 of P type semiconductor material to a depth of about 4000 Å. An oxide photoresist layer is then deposited on initial oxide layer 9 to form the 1.0 Mask. The 1.0 Mask, etch, and implant sequence is used to form a retrograde NWell region 11, as illustrated in FIG. 1. N type atoms, such as Phosphorus atoms, are implanted to an N concentration in retrograde NWell region 11. For Phosphorus, the implantation is preferably achieved at about $4 \times 10^{13}$ ions/$cm^2$@80 KeV. In an alternative embodiment of the present invention, formation of well 12 may be omitted and doping from the LDD implant alone may be used to provide the sheet resistance of one or more LDD resistive regions of the drain of the NMOS transistor structure. Of course, as earlier noted, the sheet resistance in that instance will be higher than when the NWell is employed.

Figure 2:
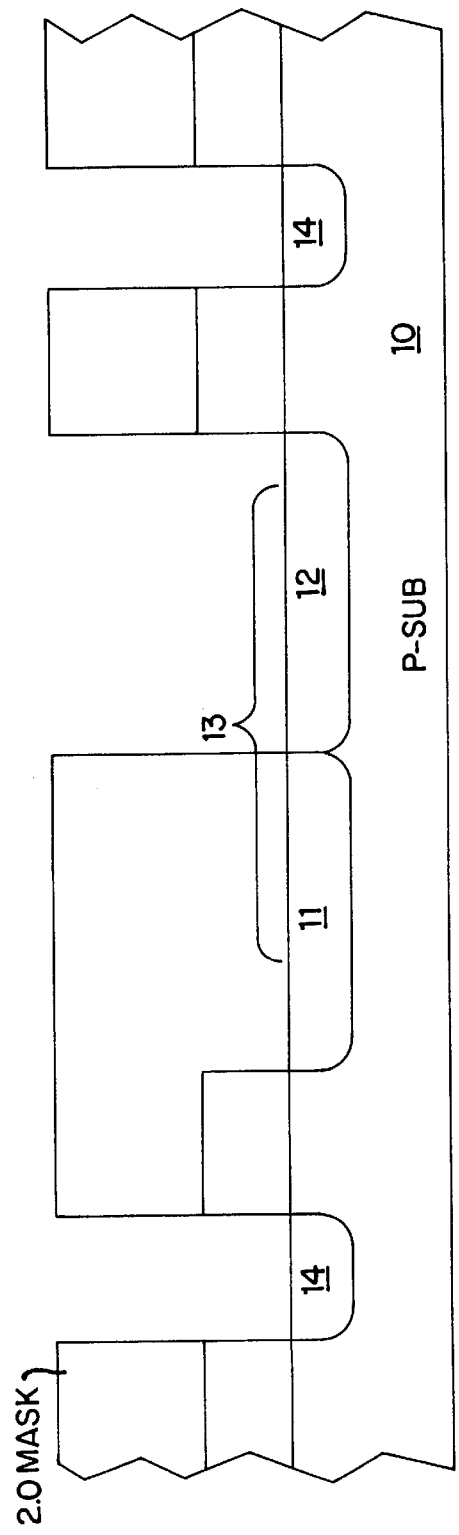
FIG. 2 is a simplified diagrammatic elevation view of the prior-art 2.0 Mask, etch and implant sequence of the CMOS fabrication process, showing the 2.0 PWell Definition Mask with CMOS PWell definition opening.

Referring to FIG. 2, the 2.0 Mask, etch, and implant sequence is used to define and implant a retrograde PWell region 12 of a CMOS transistor structure 13 and channel stop regions 14 that are adjacent to other active structures (not shown). P type atoms, such as Boron atoms, are implanted to a P concentration in retrograde PWell region 12 and channel stop regions 14. For Boron, the implantation is preferably achieved at $1.15 \times 10^{14}$ ions/$cm^2$@120 KeV. A single crystal epitaxial layer 15 of $N^-$ silicon is then deposited uniformly over a first integrated circuit structure surface 16 in a blanket epitaxial deposition. In the thermal cycle of the formation of epitaxial layer 15, retrograde NWell region 11 and retrograde PWell region 12 up diffuse to some extent, as illustrated in FIG. 3.

Isolation oxide regions 17 are established around CMOS transistor structure 13 using the 3.0 Mask, etch and oxidation growth sequence. Isolation oxide regions 17 diffuse to meet the channel stop regions 14, pinching any potential channel in that location. The oxidation process further causes upward diffusion of retrograde NWell region 11 and retrograde PWell region 12. Among other things, the 3.0 Mask is used to implant isolation oxide regions 17 with an $N^+$ concentration of Phosphorus atoms as a gettering agent. A uniform nitride layer 18 is deposited in a blanket chemical vapor deposition across a second integrated circuit structure surface 19, wherein a thin epitaxial oxide layer 20 is also formed.

Figures 3, 4:
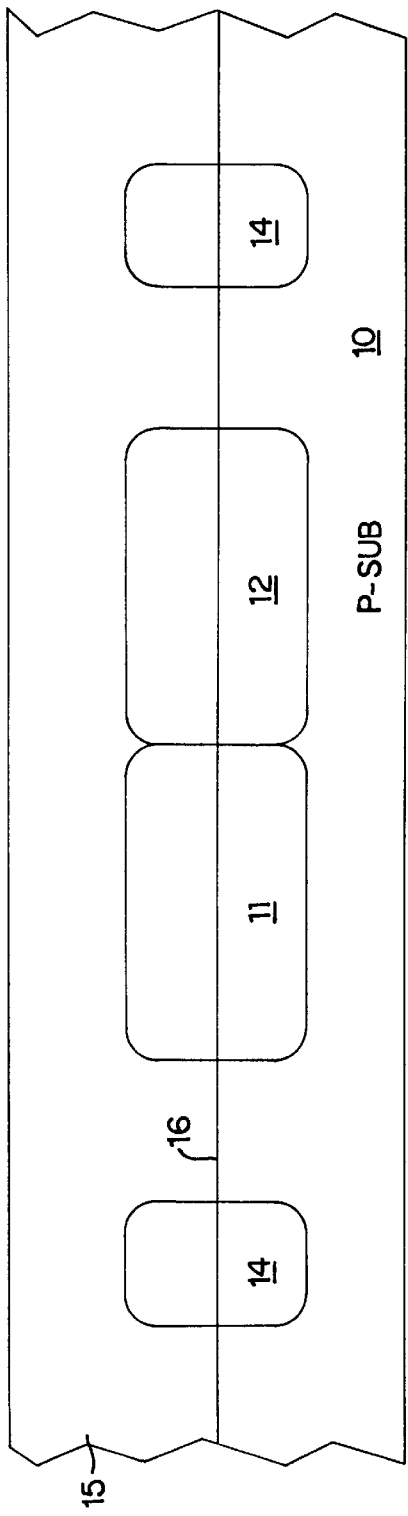
FIG. 3 is a simplified diagrammatic elevation view of the prior-art 3.0 Mask epitaxial growth step, showing the retrograde NWell and the retrograde PWell of the CMOS transistor structure and channel stop regions adjacent to all wells.
FIG. 4 is a simplified diagrammatic elevation view of the 4.0 Mask, etch, and isolation oxidation step, showing the diffused wells of the transistor structure.
Figure 5:
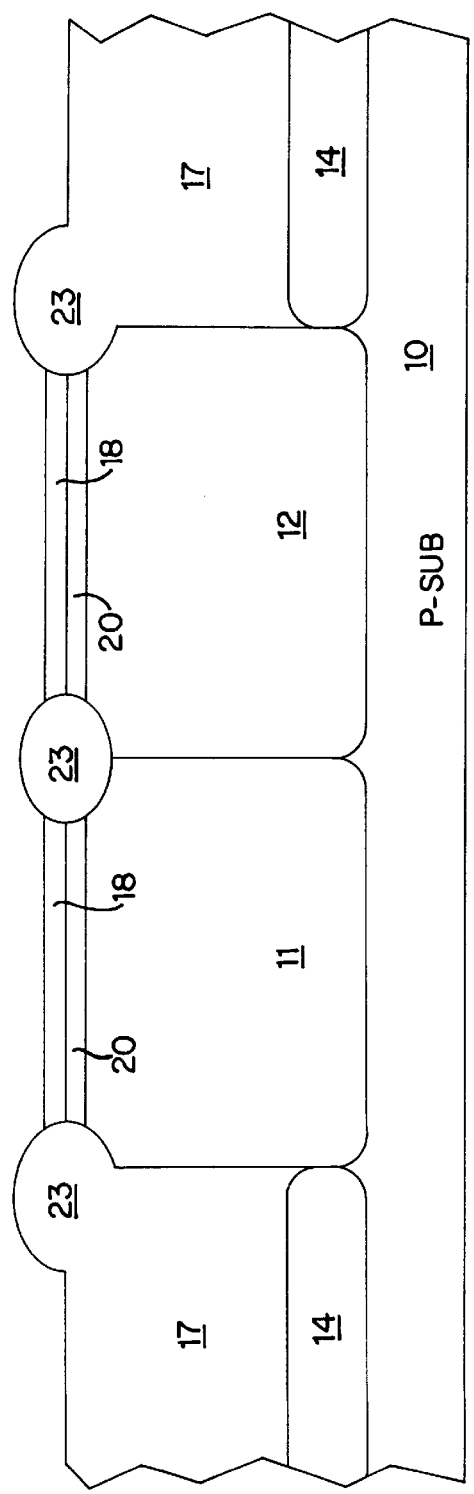
FIG. 5 is a simplified diagrammatic elevation view of the prior-art 5.0 Mask field oxidation step, showing the framing field oxide regions for the CMOS transistor structure and adjacent structures.

Referring to FIG. 4, the 4.0 Active Mask is formed for etching nitride layer 18, and defining CMOS transistor active regions 21 of a CMOS transistor structure. Field oxide openings 22 in the 5.0 Mask define field oxide regions 23 for framing the CMOS transistor structure during subsequent oxidation steps. As illustrated in FIG. 5, the field oxide regions 23, which add about 1000 Å to the thickness of the isolation oxide regions 17, isolate what will become a PMOS transistor region from an NMOS transistor region.

Figure 6:
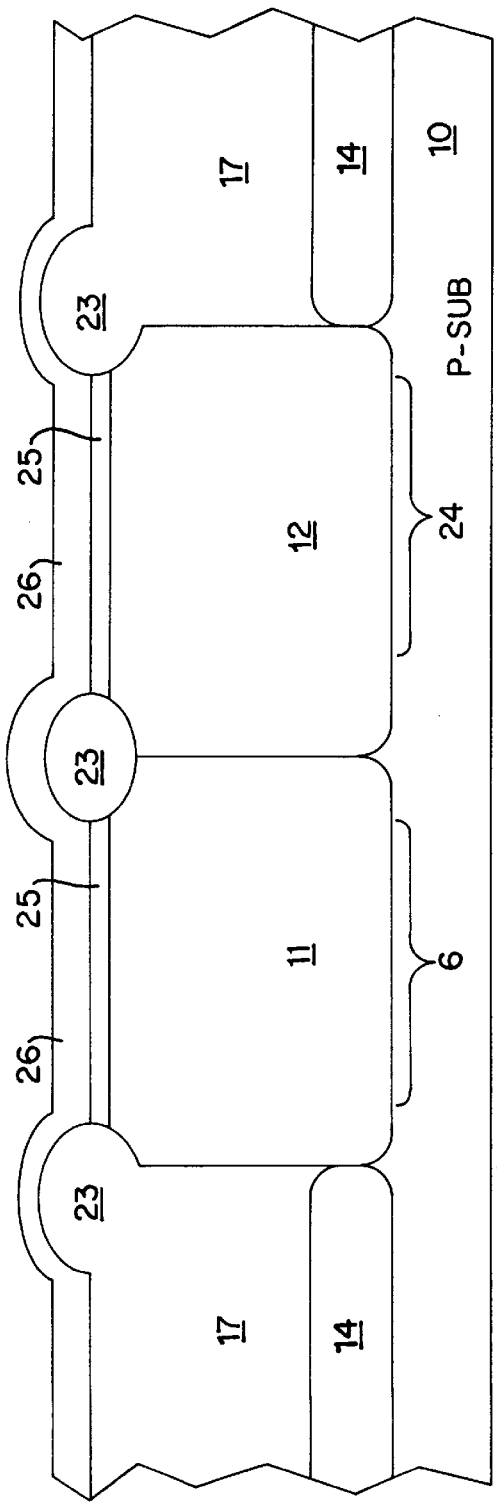
FIG. 6 is a simplified diagrammatic elevation view of the prior-art 6.0 Poly Gate Mask blanket deposition step, showing the deposited polycrystalline silicon layer over the CMOS transistor structure NWell and PWell.

In the 5.0 Active Strip Mask and etch steps nitride layer 18 is stripped from all surfaces and CMOS transistor active regions 21 are opened to expose epitaxial oxide layer 20. The epitaxial oxide layer 20 is consumed in an oxidation step to form a thin gate oxide layer 25 in the CMOS transistor active regions 21. As illustrated in FIG. 6, a blanket layer of polycrystalline silicon (poly) 26 is then chemically vapor-deposited over all structure surfaces to a depth of about 3500 Å, with doping as necessary to adjust the threshold voltage for the CMOS transistor structure to be created.

Referring to FIG. 7, the 6.0 Poly Gate Definition Mask and etch steps define an N poly gate 27 and a P poly gate 28 of the CMOS transistor structure located between the field oxide regions 23. The 6.0 Poly Gate Definition Mask steps define N poly gate 27 and P poly gate 28, using a photoresist layer and photolithographic stepper, followed by etching poly layer 26 and leaving behind N poly gate 27 and P poly gate 28 over the gate oxide layer 25. The 6.0 Poly Gate Definition Mask is designed to tightly control the dimensions of lightly-doped drains (LDD) definition openings 29 between the field oxide regions 23. It also provides for self-alignment of N poly gate 27 and P poly gate 28.

As shown in FIG. 8, a gate seal oxide layer 30 is grown over the entirety of the semiconductor wafer, including active areas containing the gate oxide layer 25, N poly gate 27, and P poly gate 28. The gate seal oxide layer 30 acts as a standoff, or spacer, for transistor channels 31 underlying N poly gate 27 and P poly gate 28. The gate oxide seal layer 30 is preferably grown to a thickness of about 400 Å over the gates, at a temperature of about 900° C., in order to provide highly-defined gates that have length dimensions, L, of about 1.0 micron. This corresponds to effective channel lengths $L_{eff}$ in the range from about 0.4 micron to about 0.6 micron.

With continuing reference to FIG. 8, the 7.0 N LDD Mask, etch and implant sequence is also used to define and implant N LDD regions 32 in the LDD definition openings 29 of PWell region 12. The 7.0 mask, field oxide regions 23, and N poly gate 27, with gate oxide seal layer 30, define the location of the N LDD regions 32. Relatively fast-diffusing Phosphorus atoms are implanted to an N concentration in those sections of the CMOS transistor active regions 21 not masked by N poly gate 27. The N LDD Phosphorus implantation is preferably conducted at a level of $1.3 \times 10^{13}$ ions/$cm^2$@60 KeV. Variations in these parameters can be made in order to adjust the doping level in the N LDD regions 32, subsequently changing the resistance of the modified ESD protection transistor structure of the present invention. This implantation is preferably conducted at two angles, an angle of about +7° from the perpendicular to the plane of the surface of the CMOS transistor structure, and an angle of about −7° from the same perpendicular.

The implantation of the N LDD regions 32 through the gate oxide layer 25 and the gate oxide seal layer 30, and into the surface of PWell 12, is done at an angle and at double dose in order to negate the shadowing effects caused by sealed poly gate 27. In this way, a portion of the transistor active region is lightly doped, thereby providing a gradual transition from transistor source region 33 through gate channel region 31 and into transistor drain region 34 so as to reduce hot electron effects. The 7.0 N LDD Mask is designed to exclude the introduction of the N LDD dopant in the area immediately adjacent to the channel below gate 27. As noted, omission of the N LDD in this region improves the current-handling capability of the device.

An annealing at about 1000° C. drives the N LDD implant to a depth of about 1500–2000 Å into PWell region 12. Although this drive is fairly deep, it is much more shallow than underlying PWell region 12. Furthermore, the LDD regions 32 are doped at a concentration that can be varied. Following the N LDD implant steps, P LDD implants are carried out in the NWell region 11. Specifically, P type ions are implanted into the NWell region in order to develop he same sort of hot electron protection described above with regard to the NMOS transistor formation. Details of the 8.0 P LDD Mask steps will not be described herein. However, it is to be understood that it may be possible to take the steps associated with modifications made to the NMOS portion of the entire structure of the present invention and apply them to the PMOS portion as well, particularly in regard to protection of the higher of two potential rails. A spacer oxide used to define the ESD resistive region of the present invention is then grown on all active areas to a depth of about 2000 Å. It is this spacer oxide that defines the depth of subsequent ion implants.

Figure 9:
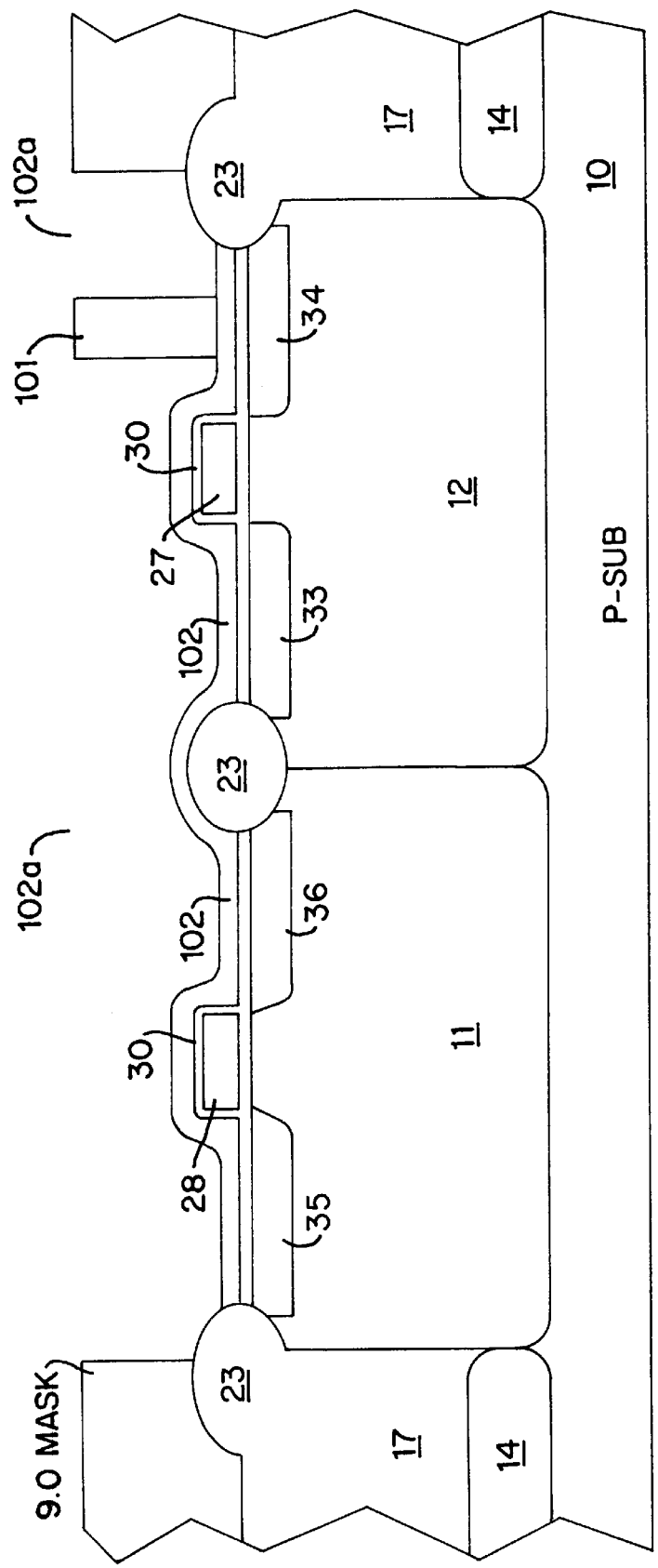
FIG. 9 is a simplified diagrammatic elevation view of the 9.0 Silicide Exclusion Mask etch sequence, showing the new Silicide Exclusion Mask with N LDD resistive region definition blocks in the NMOS drain region for the new ESD protection transistor structure of the present invention.

Modifications in the prior fabrication process and related to the creation of the new ESD protection transistor of the present invention occur in regard to the 9.0 Silicide Exclusion Mask and steps related to silicide exclusion previously described. As illustrated in FIG. 9, the new mask, implant, and etch sequences are used to define at least one new protective sealing layer over the N LDD region 32 of drain region 34. That is achieved by introducing one or more drain blocking regions 101 into the 8.0 Mask so as to prevent the etching of oxide spacer layer 102 under regions 101. It is to be noted that the blocking regions 101 are selectable as a function of ESDP requirements for structure resistivity.

Figure 10:
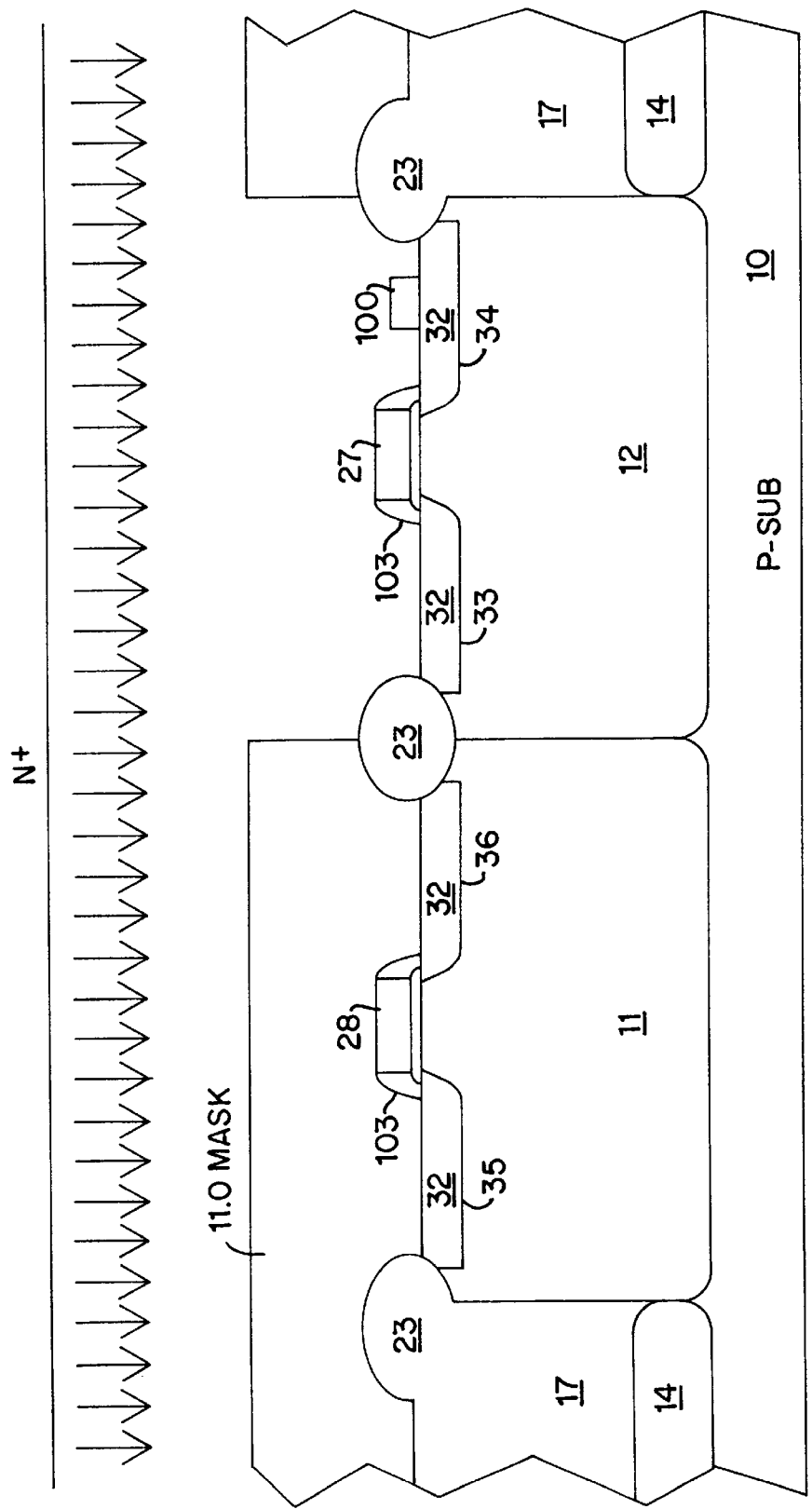
FIG. 10 is a simplified diagrammatic elevation view of the 11.0 N$^+$ Source/Drain Mask etch and implant sequence, showing the 11.0 N$_+$ Source/Drain Mask with NMOS source and drain definition openings, also showing the new N LDD resistive region in the NMOS drain region for the new transistor structure.

Subsequent etching of the semiconductor material occurring through mask openings 102a substantially removes oxide spacer layer 102, as shown in FIG. 10, except for gate-side spacer layer 103 of the prior art and new implant blocking oxide layer 100. Additionally, removal of the oxide spacer layer 102 where shown provides openings through which subsequent ion implanting and siliciding can occur.

Following the new Silicide Exclusion steps, in a CMOS or BiCMOS fabrication process, the 10.0 P+ Source/Drain Definition Mask steps are used to implant P type ions into the NWell region in order to develop a PMOS transistor. Details of those steps will not be described herein. However, it is to be understood that it may be possible to take the steps associated with modifications made to the NMOS portion of the entire structure of the present invention and apply them to the PMOS portion as well, particularly in regard to protection of the higher of two potential rails.

Figure 11:
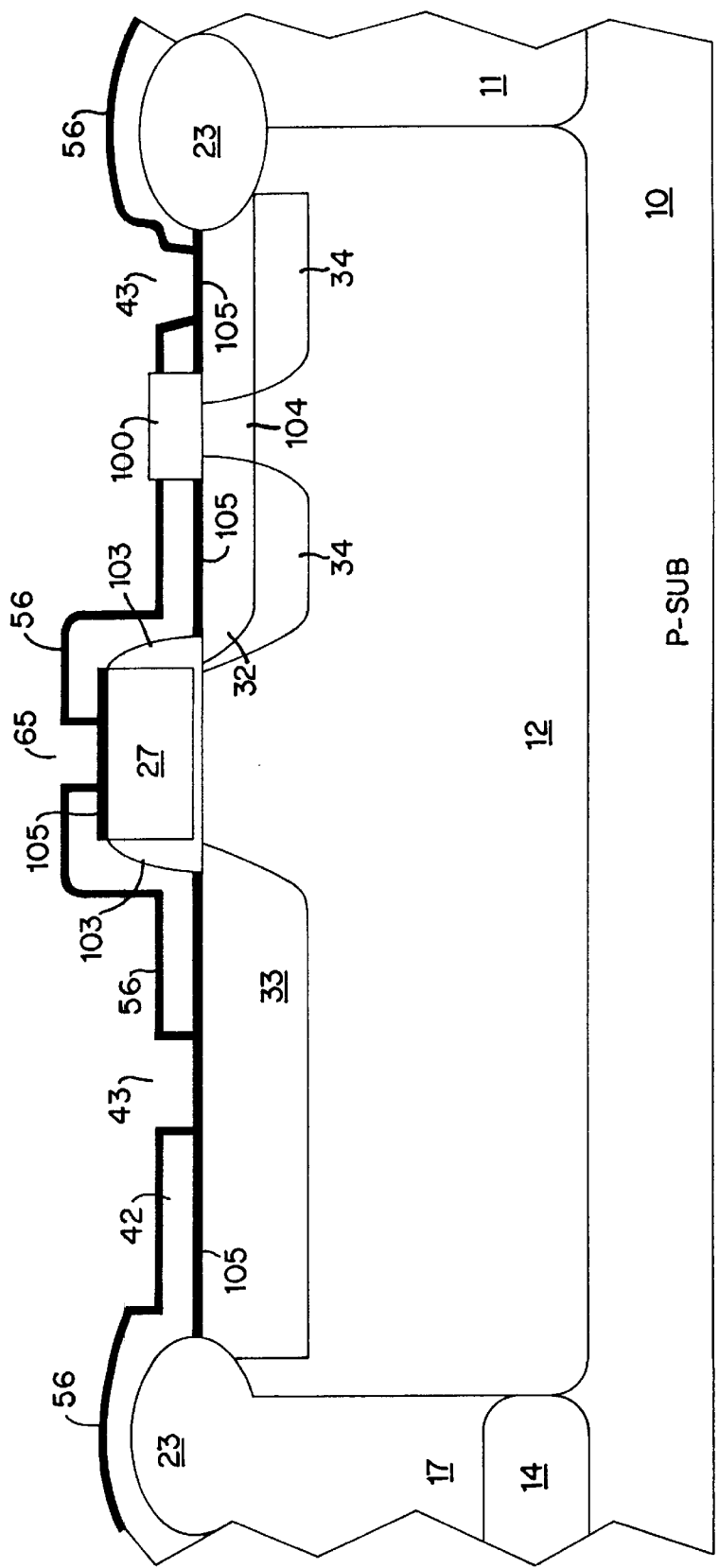
FIG. 11 is a simplified diagrammatic elevation view of the 12.0 Contact Definition Mask etch and deposition sequence, showing the metal blanket deposition.

For the purpose of the detailed description of the preferred NMOS transistor design of the present invention, those steps related to that structure will be described in detail herein. In particular, and as shown with respect to FIG. 10, the 11.0 N+ Source/Drain Definition Mask, etch and implant sequence is used to define and implant NMOS source region 33 and NMOS drain region 34 of an NMOS transistor. In the preferred embodiment of the invention, slow-diffusing 10 Arsenic atoms are implanted through the 11.0 Mask at a concentration of $7.0 \times 10^{15}$ ions/cm$^2$@100 KeV. The 11.0 Mask includes openings 41 to enable formation of NMOS source region 33 and NMOS drain region 34. Following the modified source and drain mask, etch and implant sequences of the 10.0 Mask, a low-temperature oxide layer (LTO) 42 is deposited over all surfaces, as shown in FIG. 11.

Figure 12:
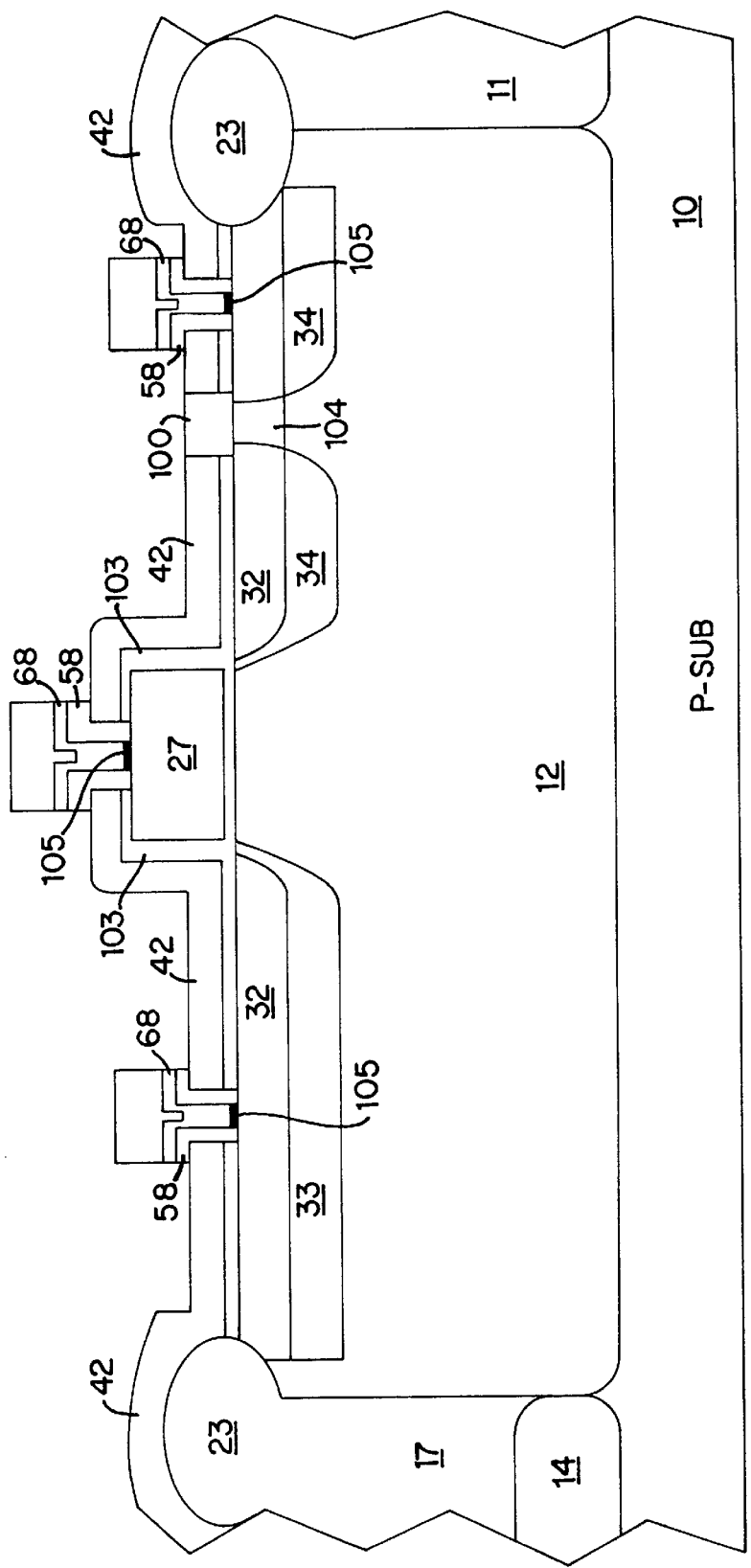
FIG. 12 is a simplified diagrammatic elevation view of results of the 13.0 and 14.0 Metal 1 and Metal 2 Definition Mask, etch and deposition sequences, showing the new N LDD resistive region in the new transistor drain.

The 12.0 Contact Definition Mask and etch sequence removes LTO 42 over MOS metal contact areas 43 corresponding to source region 33 and drain region 34. As shown in FIG. 11, the CMOS metal contact areas 43 are preferably formed after blanket deposition of Titanium or Platinum, or some other suitable metal, such as Aluminum, Tantalum, Molybdenum, or the like, in order to form a refractory metal blanket 56 over all surfaces. After blanket deposition and sintering, all "unsilicided" metal is removed, such as that on the sealing layers 100 and 103, leaving metal-silicide composite 105 in all contact areas, including the CMOS contact areas 43 and gate contact area 65. Blocking sealing layer 100 leaves in place LDD resistive regions 104 that provide the resistance desired in an ESD protection transistor structure. The final relevant steps in the process are shown in FIGS. 11 and 12 and include the 13.0 M1 Definition Mask sequence of depositing a first Metal 1 (M1) layer 58, preferably a suitable metal combination, such as Titanium/Tungsten and Aluminum/Copper. In subsequent mask steps a second metal layer 68 is deposited and defined using the 14.0 M2 Mask and deposition sequence. Finally, bond pads are defined, etched, and created.

While the invention has been described with reference to particular example embodiments, it is intended to cover all modifications and equivalents within the scope of the following claims.

We claim:

1. A process for fabricating an ESD protection device formed of a transistor structure, the process comprising the steps of:
   a. forming an epitaxial layer of semiconductor material of first conductivity type on a semiconductor substrate;
   b. forming a retrograde well of second conductivity type in said epitaxial layer;
   c. forming a low-density drain region of said second conductivity type at a surface of said retrograde well, wherein said low-density drain region is omitted from a region of said epitaxial layer adjacent to a channel region of the transistor structure;
   d. removing a portion of a spacer oxide on a surface of said low-density drain region and leaving one or more drain blocking regions on said surface of said low-density drain region; and
   e. forming a drain region of said second conductivity type in exposed portions of said low-density drain region such that said drain region is not formed under remaining portions of said spacer oxide, wherein a charge carrier concentration of said drain region is higher than a charge carrier concentration of said low-density drain region.

2. The process as claimed in claim 1 wherein the step of removing a portion of said spacer oxide includes leaving an exposed portion of said surface of said low-density drain region immediately adjacent to a control node region of said transistor structure.

3. The process as claimed in claim 1 further comprising the step of forming a plurality of said transistor structures in combination to create said ESD protection device.

4. A process for fabricating an ESD protection device formed of a transistor structure, the process comprising the steps of:
   a. forming an epitaxial layer of semiconductor material of first conductivity type on a semiconductor substrate;
   b. forming a low-density drain region of a second conductivity type at a surface of said epitaxial layer, wherein said low-density drain region is omitted from a region of said epitaxial layer adjacent to a channel region of the transistor structure;
   c. removing a portion of a spacer oxide on a surface of said low-density drain region and leaving one or more drain blocking regions on said surface of said low-density drain region; and
   d. forming a drain region of said second conductivity type in exposed portions of said low-density drain region such that said drain region is not formed under remaining portions of said spacer oxide, wherein a charge carrier concentration of said drain region is higher than a charge carrier concentration of said low-density drain region.

5. The process as claimed in claim 4 wherein the step of removing a portion of said spacer oxide includes leaving an exposed portion of said surface of said low-density drain region immediately adjacent to a control node region of said transistor structure.

6. The process as claimed in claim 4 further comprising the step of forming a plurality of said transistor structures in combination to create said ESD protection device.

* * * * *